United States Patent [19]

Burghartz et al.

[11] Patent Number: 5,059,544

[45] Date of Patent: Oct. 22, 1991

[54] METHOD OF FORMING BIPOLAR TRANSISTOR HAVING SELF-ALIGNED EMITTER-BASE USING SELECTIVE AND NON-SELECTIVE EPITAXY

[75] Inventors: Joachim N. Burghartz, Croton-on-Hudson; Barry J. Ginsberg, Yorktown Heights; Siegfried Mader, Croton-on-Hudson, all of N.Y.

[73] Assignee: International Business Machines Corp., Armonk, N.Y.

[21] Appl. No.: 219,020

[22] Filed: Jul. 14, 1988

[51] Int. Cl.[5] .................................. H01L 21/331
[52] U.S. Cl. .................................. 437/31; 437/89; 437/99; 437/162; 437/909; 148/DIG. 11
[58] Field of Search ............. 437/31, 32, 33, 89, 437/99, 162, 909, 917; 148/DIG. 10, DIG. 11

[56] References Cited

U.S. PATENT DOCUMENTS

| | | | |
|---|---|---|---|
| 3,579,814 | 5/1971 | Dill, Jr. et al. | 29/578 |
| 4,004,954 | 1/1977 | Tshudy et al. | 357/30 |
| 4,056,413 | 11/1977 | Yoshimura | 156/626 |
| 4,236,294 | 12/1980 | Anantha et al. | 437/31 |
| 4,324,814 | 4/1982 | Reichert | 427/86 |
| 4,462,847 | 7/1984 | Thompson et al. | 156/614 |
| 4,483,726 | 11/1984 | Isaac et al. | 148/187 |
| 4,499,657 | 2/1985 | Ooga et al. | 357/34 |
| 4,504,332 | 3/1985 | Shinada | 357/34 |
| 4,507,158 | 3/1985 | Kamins et al. | 148/DIG. 26 |
| 4,522,662 | 6/1985 | Bradbury et al. | 148/DIG. 25 |
| 4,545,114 | 10/1985 | Ito et al. | 437/31 |
| 4,578,142 | 3/1986 | Corboy, Jr. et al. | 156/610 |
| 4,640,721 | 2/1987 | Uehara et al. | 437/31 |
| 4,729,965 | 3/1988 | Tamaki et al. | 437/162 |
| 4,746,629 | 5/1988 | Hanagasaki | 437/162 |
| 4,818,713 | 4/1989 | Feygenson | 437/90 |

FOREIGN PATENT DOCUMENTS 58-56320 4/1983 Japan .

OTHER PUBLICATIONS

J. N. Burghartsz et al. "Selective Epitaxy Base Transistor (SEBT)", IEEE Electron Device Letters, vol. 9, No. 5, May 1988.
D. R. Bradbury et al., Control of Lateral Epitaxial Chemical Vapor Depositon of Silicon Over Insulators, J. Appl. Phys. 55 (2) Jan. 1984, pp. 519–523.
B. Ginsberg et al., Low Temperature Selective Epitaxy Using SiCl$_4$ at Reduced Pressure, 10th Conference on Chemical Vapor Deposition, Electrochemical Society, Honolulu, Hawaii 1987, pp. 991–992.
G. R. Srinivasan et al., Current Status of Reduced Temperature Silicon Epitaxy by Chemical Vapor Deposition, J. Electrochem. Soc.: Solid-State Science and Technology, Jun. 1987, pp. 1518–1524.

Primary Examiner—Brian E. Hearn
Assistant Examiner—Tuan Nguyen
Attorney, Agent, or Firm—Scully, Scott, Murphy & Presser

[57] ABSTRACT

Selective and non-selective epitaxial growth is utilized to form a bipolar transistor having self-aligned emitter and base regions. A substrate of semiconductor material of a first conductivity type is provided and a first layer of semiconductor material of a second conductivity type is non-selectively epitaxially grown on the substrate. An insulating element is formed on a portion of the first layer of semiconductor material and a second layer of semiconductor material of the second conductivity type is selectively epitaxially grown on the first layer such that a portion of the second layer laterally overgrows onto an upper surface of the insulating element. The lateral overgrowth forms an aperture in the second layer to expose a region of the upper surface of insulating element. A layer of insulating material is formed on the second layer to isolate the second layer of semiconductor material from a subsequent deposition of conductive material. The portion of the insulating layer formed within the aperture narrows the aperture and the exposed region of the element. The exposed region of the element is removed to expose a portion of the first layer and an emitter region of the first conductivity type is formed in the first layer through the aperture.

20 Claims, 3 Drawing Sheets

METHOD OF FORMING BIPOLAR TRANSISTOR HAVING SELF-ALIGNED EMITTER-BASE USING SELECTIVE AND NON-SELECTIVE EPITAXY

BACKGROUND OF THE INVENTION

1. Field of the Invention

This invention relates to the manufacture of bipolar transistors, and more particularly, to the method of forming the emitter window for a bipolar transistor having self-aligned emitter-base regions.

2. Description of the Prior Art

In the manufacture of bipolar transistors, much is research has been directed to increasing transistor speed. One approach to increasing the speed is by means of the transistor geometry. For high speed bipolar transistors, the two critical dimensions are the emitter stripe width and the base thickness. The emitter stripe width is defined by the lateral dimension of the emitter region, while the base thickness is defined by the vertical dimension of the base region. It is desirable to manufacture transistors with both the emitter strip width and the base thickness as small as possible so as to reduce the base resistance for the reason that base resistance is a major impediment to the speed of a transistor. Moreover, the ratio of the length to the width of the emitter should be as large as possible and since the emitter length is determined by other manufacturing constraints, the emitter stripe width is the only dimension that can be adjusted to reduce the base resistance.

In the manufacture of conventional bipolar transistors, the emitter window which defines the stripe width is located and sized by the use of photolithography. A photolithographic mask is positioned onto a layer of polysilicon which has been epitaxially grown onto a single crystal silicon substrate, and an emitter window is then etched through the polysilicon to expose regions of the single crystal silicon. Experience shows that etching an emitter opening into an extrinsic base polysilicon layer without overetch into an intrinsic base region is very difficult. The photolithographic method for defining the emitter window has a size limitation in that, typically the smallest emitter stripe width that can be obtained is approximately 0.7 microns. In addition, the use of photolithography masking techniques results in inaccuracies due to improper alignment with the intrinsic base resulting in poor reproducibility.

Various techniques have been employed to define the emitter window in an attempt to overcome the prior art deficiencies. In U.S. Pat. No. 4,499,657, photolithography is used to define both the emitter and base windows simultaneously thereby reducing some of the misalignment effects. The emitter stripe width is limited to the range between 0.5 to 2 microns.

U.S. Pat. No. 4,504,332 discloses a self-alignment technique for manufacturing a bipolar transistor. A thermal oxide layer, silicon nitride layer and a boron oxide layer are successively deposited onto a single crystal silicon substrate. Conventional photolithographic techniques are used to etch a window for the formation of both the base and the emitter. A layer of silicon is epitaxially grown over the entire substrate with polysilicon being formed on the insulating layer and single crystal being formed on the exposed region of the substrate. The polysilicon regions are doped to form external base regions. A conformal layer of thermal oxide is deposited over the poly and single crystal silicon regions and the thermal oxide is etched to expose the single crystal. An internal base region is formed by implantation and the emitter region is formed by diffusion from a conformal doped oxide layer. Contact holes are then etched in the oxide layer for the emitter, base and collector. While the emitter and base are self-aligned, the process steps are numerous and complicated. In addition, the emitter window is defined by conventional photolithographic techniques and therefore, the width is limited in size.

SUMMARY OF THE INVENTION

This invention is directed to a method for fabricating bipolar transistors wherein the emitter window is defined by the use of selective epitaxial growth of silicon. The inventive method of the present invention results in a transistor having a much narrower emitter stripe width than heretofore possible in the prior art. The emitter stripe width of the transistor of the present invention may be less than 0.5 microns, and can be on the order of 0.1 micron.

The inventive method for fabricating a bipolar transistor comprises the steps of providing a substrate of semiconductor material of a first conductivity type, and depositing by nonselective epitaxy a first layer of semiconductor material of a second conductivity type on the substrate. An element of insulating material is formed over a portion of the first layer, and a second layer of semiconductor material of the second conductivity type is deposited onto said first layer by selective epitaxy. The selective epitaxy results in a portion of the second layer laterally overgrowing onto a portion of an upper surface of the element. An aperture is thereby formed in the second layer leaving an exposed region on the upper surface of the element. A layer of insulating material is formed on the second layer which narrows the aperture and reduces the exposed region of the element. The exposed region of said element is removed to expose a portion of the first layer and a region of the first conductivity type is formed in said first layer through the aperture.

In accordance with one embodiment of the invention, an npn transistor is formed wherein the substrate of semiconductor material, such as silicon, having an n-type conductivity is provided with a mesa-like portion surrounded by recessed oxidation isolation regions. A first layer of silicon having a p-type conductivity is deposited over the mesa-like portion and the isolation regions by the use of a conventional non-selective epitaxial growth technique. The deposition results in regions of polycrystalline silicon being formed over the isolation regions of the substrate and a region of single crystal silicon being formed over the mesa-like portion. The element of insulating material is formed over a portion of the single crystal region and includes at least a layer of silicon nitride. An oxide layer, such as silicon dioxide, may be provided between the nitride layer and the first layer of silicon.

A second layer of silicon of a p-type conductivity is deposited on the single crystal and polycrystalline silicon regions of the first layer. The deposition of the second layer of silicon results in polysilicon being deposited over the polysilicon in the first layer and single crystal silicon being deposited over the single crystal silicon in the first layer. The second layer of silicon is deposited by a selective epitaxial technique so that a portion of the single crystal material laterally overgrows onto a portion of the nitride resulting in an aperture leaving an exposed region on the surface of the nitride. A layer of insulating material is formed on the second layer of silicon by a high pressure thermal oxidation. The portion of the thermal oxide covering the walls of the aperture narrows the aperture and consequently reduces the width of the exposed region of the nitride. The narrowed exposed region is thereafter removed to expose a portion of the single crystal region of the first layer of silicon.

A region of n-type conductivity is formed in the exposed portion of said single crystal region to form the emitter of the transistor. The area of the single crystal material below the emitter region forms an intrinsic base and the mesa-like region forms the collector of the transistor. The emitter is formed by conventional techniques, such as, depositing a region of undoped polysilicon into the aperture, implanting n-type dopant and annealing to outdiffuse the dopant into the single crystal region. The portions of the single and polycrystalline regions adjacent the intrinsic base and insulating element form extrinsic base regions. Metallic contacts are formed to contact the extrinsic base, the collector and the polysilicon emitter to complete the transistor.

Thus, in accordance with the invention, the window for forming the emitter region is formed by the selective epitaxial growth of semiconductor material. The term selective growth as herein employed refers to substantially uniform growth of silicon along surfaces of silicon and in which the silicon overgrows onto a portion of an insulating element. A selective epitaxial growth technique is preferrably utilized with growth conditions such that equal growth rates in both the vertical and horizontal directions for the region of overgrowth is provided. The overgrowth is controlled and stopped to form the desired emitter stripe width. A high pressure thermal oxidation layer is deposited on the selective epitaxial layer to insulate the polysilicon emitter from the extrinsic base regions which also has the effect of further reducing the size of the emitter stripe width. The formation of the emitter window by this method provides for the self-aligned formation of the intrinsic base and emitter. The prior art limitations of the photolithographic techniques for forming the emitter window are substantially avoided by the present invention. The adjustment of the size of the emitter window by the selective epitaxial growth and the readjustment of that window by the spacer thermal oxide allows for very good reproducibility. The completely single crystalline extrinsic base allows for a minimal depth of the emitter window and therefore a very low emitter resistance. In addition, the resistance of the polysilicon extrinsic base can be further lowered by silicide formation. The oxide spacer prevents tunneling between the high doped outdiffusions of the emitter and the extrinsic base.

DETAILED DESCRIPTION OF THE INVENTION

Figure 1:
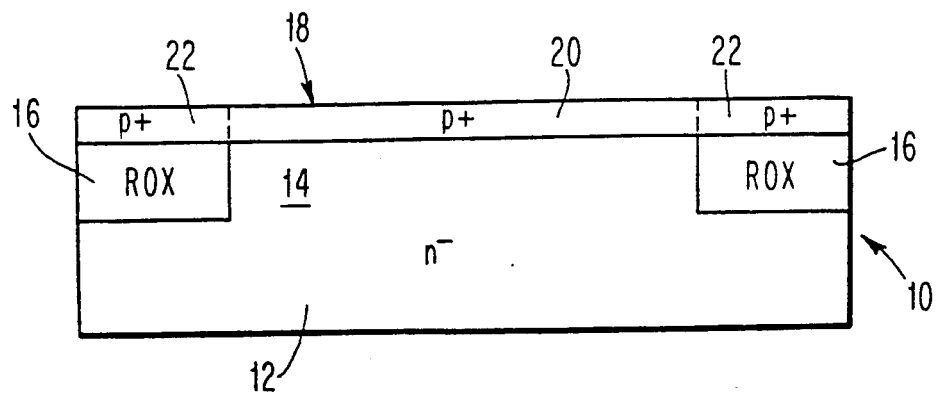
FIGS. 1–7 are schematic sectional views illustrating steps of manufacturing a bipolar transistor according to an embodiment of the invention.

Referring now to the drawings, FIG. 1 depicts a structure 10 that includes a single crystal silicon substrate 12 having a mesa-like portion 14 surrounded by isolation regions 16. The mesa-like portion is doped with a first conductivity type. The illustrative embodiment shown in the drawings is of an npn transistor, however, it should be understood that the method of the invention may also be utilized to form a pnp transistor. The mesa-like region 14 is typically lightly n-doped by conventional diffusion or implantation techniques and region 16 are well known recessed oxide regions. A non-selective epitaxial layer 18 of semiconductor material is grown on the substrate 12 by conventional epitaxial growth techniques. The silicon grows in a single crystalline form in region 20 above the single crystalline mesa-like region 14 and polysilicon is grown in regions 22 above the recessed oxide regions 16. In the drawing, the broken lines indicate the interface of the single crystal and polycrystalline regions. The layer 18 is p-doped typically in the range of $2 \times 10^{18}$ cm$^{-3}$. The doping of the layer 18 may be provided simultaneously with the epitaxial growth or the dopant may be subsequently implanted into the layer. Layer 18, typically is in the range between 500 and 1,000 angstroms thick.

Figure 2:
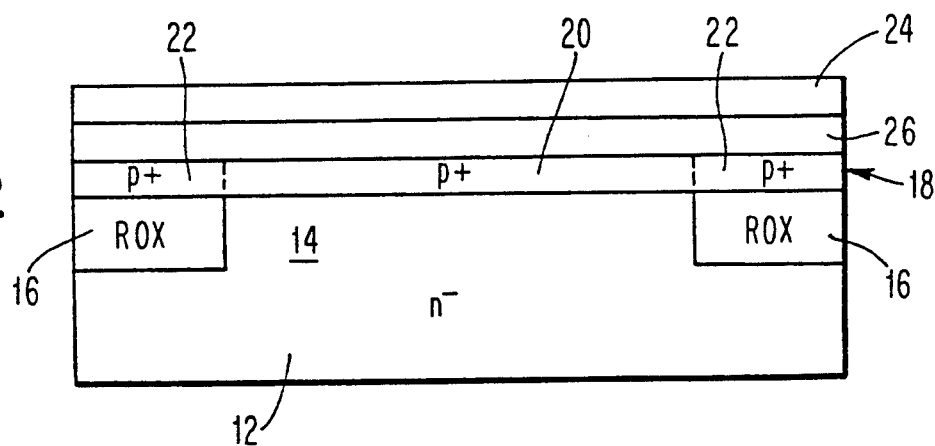

An insulating element is formed on the layer 18 by depositing at least a barrier layer 24, typically of silicon nitride on the layer 18. In the illustrative embodiment shown in FIG. 2, a thermal oxide layer 26, typically of silicon dioxide, is first deposited on the layer 18 and the silicon nitride layer 24 is then deposited on the oxide layer 26. The oxide layer 26 is typically in the range of 40 angstroms thick and the nitride layer 24 is typically in the range of 300 angstroms. The nitride layer may be deposited by a low pressure chemical vapor deposition (LPCVD) technique.

Figure 3:
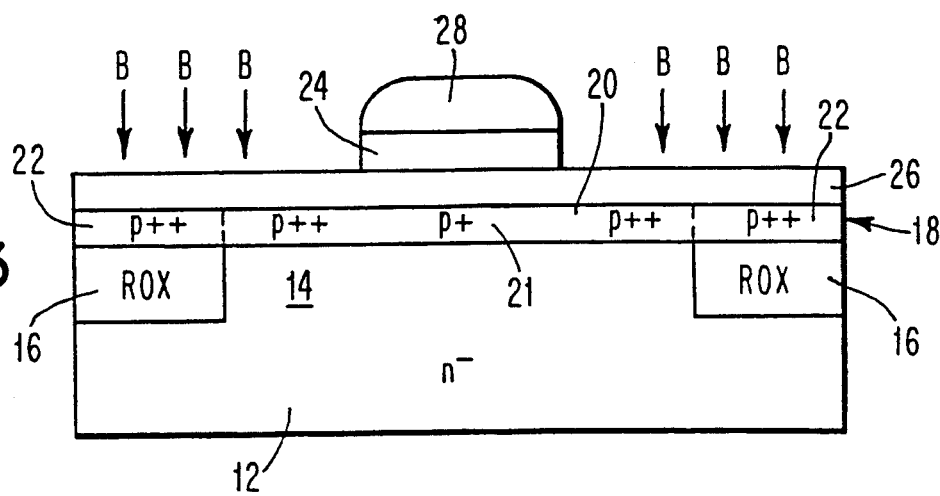

As shown in FIG. 3, a resist 28 is placed on the nitride layer 24 over the mesa-like region 14. The width of the resist 28 will define the insulating element of the final structure and should be provided larger than the desired emitter stripe width. Reactive ion etching is then utilized to etch away the nitride layer and exposed the oxide layer 26. Optionally, a very shallow implantation of boron may be made through the oxide layer 26 to highly dope the portions of the silicon layer 18, typically in the range of $2 \times 10^{19}$ cm$^{-3}$, on both sides of the nitride layer 24. The additional doping lowers the resistance of these regions, which form part of the extrinsic base of the transistor. The p+ region 21 below the nitride element 24 forms the intrinsic base.

Figure 4:
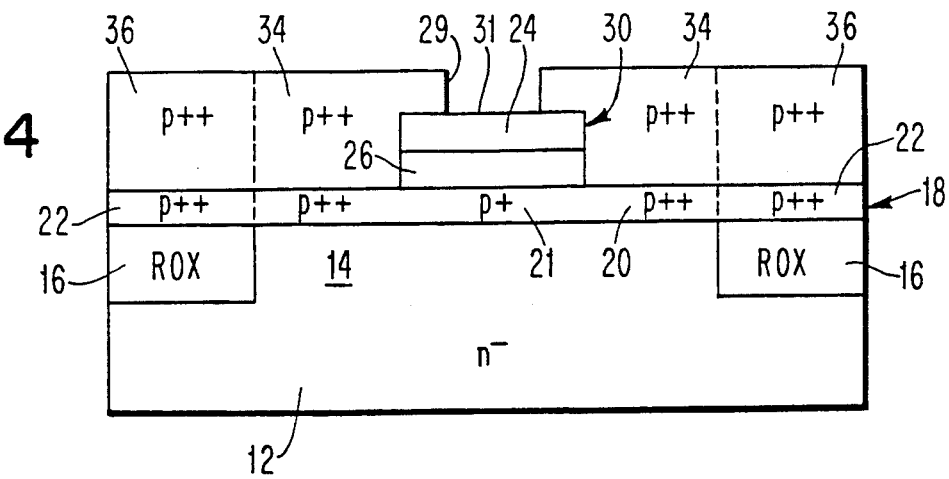

As shown in FIG. 4, the oxide layer 26 is then removed by a wet etch such as dilute HF, the resist is removed and the surface of the structure is cleaned. Thus, an insulating element 30 is formed from the remaining portions of layers 24 and 26. Thereafter, selective expitaxy is used to grow a second layer 32 of highly p-doped silicon which selectively overgrows a portion of the insulating element 30. The second layer 32 of silicon grows with single crystal regions 34 over the single crystal region 20 of layer 18 and polysilicon regions 36 over the polysilicon regions 22 of layer 18. Regions 34 and 36, together with the highly p-doped region of layer 18, forms the extrinsic base of the transistor.

The growth of layer 32 initially grows to the thickness of the insulating element 30 and then overgrows onto the element 30 to form an aperture 29 leaving an exposed portion 31 of an upper surface 33 of the element 30. In a preferred embodiment, the selective epitaxial technique results in equal growth rates in the vertical and horizontal directions. It is known that when the pattern formed by the element 30 is parallel to the (100) crystalline axis, equal growth rates will result. In addition, it is known that the growth rate in the (100) direction is much higher than in the (110) direction. Thus, after reaching the upper surface 33 of the insulating element 30, the layer 32 grows an equal amount laterally along the surface 33 as it grows vertically above surface 33. Thus, a rectangular emitter hole is possible even if the lithography pattern defined by the insulating element 30 is circular in shape. An example of selective epitaxial techniques that may be employed are as shown by Ginsberg, et al., Lower Temperature Selective Epitaxy Using SiCl$_4$ at Reduced Pressure, Extended Abstracts, 10th Conference on Chemical Vapor Deposition, Electro Chemical Society, Honolulu, Hawaii, 1987, pp. 991, 992.

The selective epitaxial layer 32 is typically grown to a thickness between 1,000 and 3,000 angstroms. Preferably, the growth temperatures are maintained at 875° C. or lower. Techniques have now been shown in which the epitaxial growth is performed at temperatures below 700° C. In the practice of the invention, it is desirable to keep the growth temperatures as low as possible to avoid damage to the intrinsic base formed below the insulating element 30. The selective epitaxial growth of layer 32 is deposited under growth conditions that may be easily controlled to provide the aperture 29 with a desired width. The width of the aperture 29 may be less than 0.5 microns, and may be as low as 0.1 micron.

Figure 5:
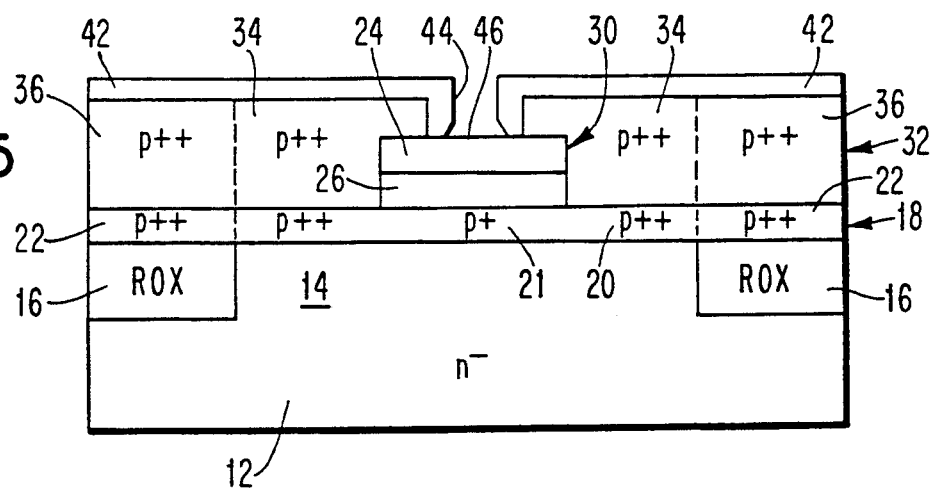

As shown in FIG. 5, a thermal oxide layer 42 is deposited onto the selective epitaxy layer 32. The layer 42 isolates the extrinsic base regions from a subsequent polysilicon emitter formation. In addition, the width of the aperture 29 of FIG. 4 will be reduced by the deposition of thermal oxide layer 42. The layer 42 is formed preferably by a high pressure low temperature oxidation process. The layer 42 contacts a portion of the exposed region 31 of the element 30. Thermal oxidation is preferrably performed in temperatures between 700° and 800° C. to prevent the intrinsic base region 21 from diffusing out. During the thermal oxidation, the nitride layer 24 acts as an oxide barrier to prevent oxidation of the intrinsic base region 21. The thermal oxide layer 26 functions to relieve distortion that would be present if the nitride layer was directly contacting the layer 18. The oxide layer 42 is typically grown to a thickness of 1,000 to 2,000 angstroms. The layer 42 results in a much narrower aperture 44 and a reduced exposed region 46.

Figure 6:
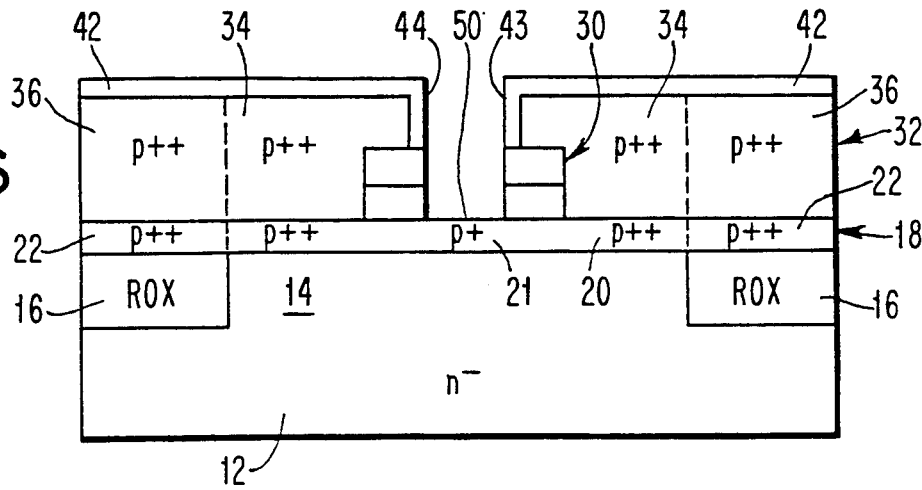

Thereafter, as shown in FIG. 6, the exposed portion 46 of the nitride layer is selectively etched typically by a dry etch process and a portion of the oxide layer 26 is removed by a wet etch process to form a trench 43 in the element 30 and expose a region 50 contiguous with the single crystal intrinsic base region 21. A small portion of the thermal oxide layer 42 is also removed within the aperture 44 so that the side edges of the layer 42 and the element 30 are coextensive thereby forming an insulating extension of the trench 43.

Figure 7:
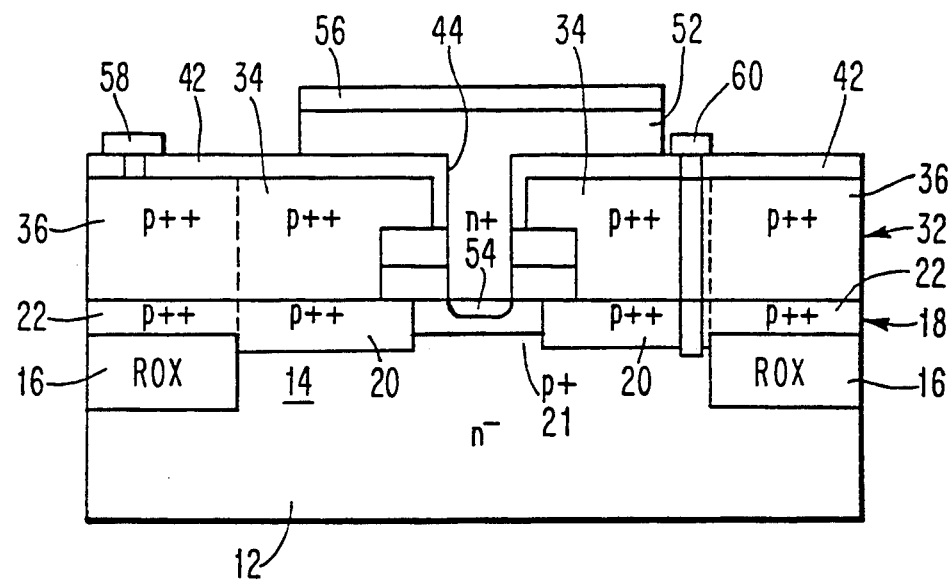

As shown in FIG. 7, a conductive element of polysilicon is deposited within the trench 43 and aperture 44 to contact the region 50 and extend over the layer 42. The region of polysilicon 52 is implanted with a dopant, typically arsenic, and heated to diffuse an n-type region 54 into the single crystal region 21, which has a slightly less concentration of dopant, to form the emitter. A portion of the intrinsic base 21 diffuses into the single crystal region 14 in a like amount. A metallic contact 56 is formed on the element 52 as the emitter contact and contacts 58 and 60 are deposited as base and collector contacts, respectively.

Figure 8:
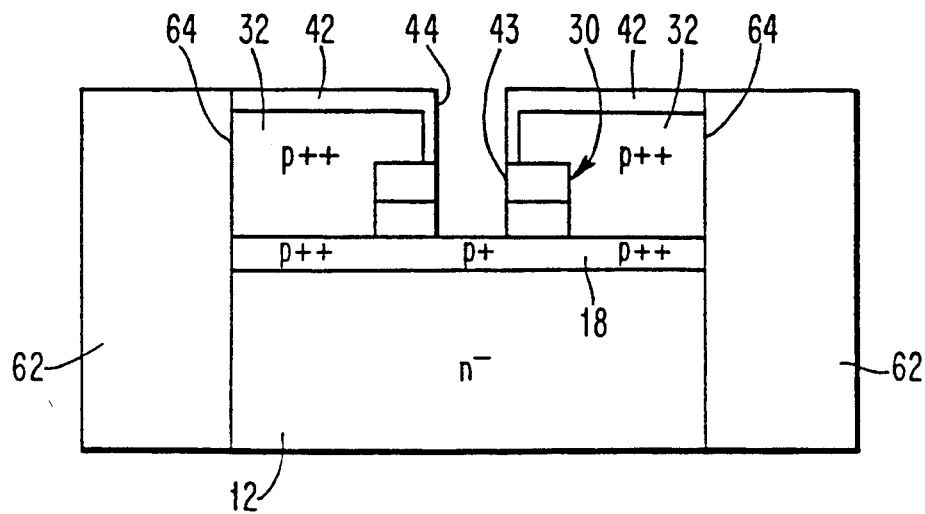
FIG. 8 is a schematic sectional view of a bipolar transistor of another embodiment of the invention.

In an alternative embodiment, as shown in FIG. 8, isolation regions 62 are formed after the formation of the emitter window 43, 44. In FIG. 8, like parts are indicated by like numerals used in FIGS. 1-7. After the emitter window is defined as described above, trenches 64 are formed and filled with appropriate isolation material to form isolation regions 60. In this embodiment, the layers 18 and 32 are completely single crystal silicon because the substrate 12 is initially provided without isolation regions. Isolation regions 60 may be filled with any insulating material such as an oxide or a nitride or it may also be filled by polysilicon. The emitter regions may then be formed by typical diffusion techniques.

In accordance with the method of the invention, the emitter region 54 and intrinsic base region 21 are formed in a self-aligned manner by use of selective epitaxy to define the emitter window 43, 44. In addition, the vertical spacer provided by layer 42, between the extrinsic base regions 34 and the emitter region 54 prevents tunneling between the high doped outdiffused emitter 54 and the extrinsic base. Thus, optical lithography is no longer necessary to define the emitter window. Optical lithography is only used to define the pattern for forming the insulating element on which the selective epitaxy is grown. The selective epitaxy results in an emitter stripe width in the submicron range which may be less than 0.5 microns and as low as 0.1 micron. The width may be further reduced by the deposition of the insulating layer. Thus, there is no longer a need to etch a whole stack of polysilicon to implant the base and emitter.

While the invention has been particularly shown and described with respect to preferred embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for fabricating a bipolar transistor comprising the steps of:

providing a substrate of semiconductor material of a first conductivity type a portion of which forms a collector region;

depositing a first layer of semiconductor material of a second conductivity type on said substrate, a portion of which forms an intrinsic base region;

forming an element of insulating material over a portion of said first layer, said intrinsic base region being formed below said element and the remainder of said first layer forming an extrinsic base region;

depositing a second layer of semiconductor material of said second conductivity type on said first layer, a portion of said second layer laterally overgrowing onto a portion of an upper surface of said element defining an aperture and leaving an exposed region on the upper surface, the second layer forming a portion of the extrinsic base region;

forming a layer of insulating material on said second layer which narrows said aperture and said exposed region of said element;

removing said narrowed exposed region of said element to expose a portion of said first layer below said aperture; and forming an emitter region of said first conductivity type in said first layer through said aperture.

2. The method of claim 1 wherein the step of forming said emitter region includes providing a conductive element within said aperture through which said emitter region is outdiffused.

3. The method of claim 2 wherein the semiconductor material of the substrate and the first and second layers is silicon.

4. The method of claim 1 wherein the substrate is provided with a mesa-like region of said first conductivity type surrounded by isolation regions.

5. The method of claim 4 wherein the deposition of the first and second layers of semiconductor material of said second conductivity type are formed with single crystal material over said mesa-like portion and polycrystalline material over said isolation regions.

6. The method of claim 1 further including forming isolation regions within said substrate and first and second layers of semiconductor material on both sides of and spaced from said emitter region.

7. The method of claim 1 wherein the step of forming an element of insulating material comprises depositing a thermal oxide buffer layer onto a portion of said first layer and depositing a nitride barrier layer onto said thermal oxide buffer layer.

8. The method of claim 1 wherein the step of depositing a first layer of semiconductor material comprises non-selectively epitaxially growing said first layer.

9. The method of claim 8 wherein the step of depositing said second layer of semiconductor material comprises selectively epitaxially growing said second layer.

10. A method for fabricating a bipolar transistor comprising the steps of:
  providing a substrate of semiconductor material of a first conductivity type, said substrate including a mesa-like portion surrounded by isolation regions,
  depositing a first layer of semiconductor material of a second conductivity type over said mesa-like portion and said isolation regions providing a single crystal region over said mesa-like portion and a polycrystalline region over said isolation regions,
  forming an element of insulating material over a portion of said single crystal region,
  depositing a second layer of semiconductor material of said second conductivity type onto said single crystal and said polycrystalline regions, a portion of which laterally overgrows onto said element leaving an exposed region on the surface of said element,
  forming a layer of insulating material on said second layer which contacts a portion of said exposed region thereby narrowing said exposed region of said element,
  removing said narrowed exposed region of said element to expose a portion of said single crystal region of said first layer, and
  forming an emitter region of said first conductivity type in said single crystal region of said first layer through said exposed portion of said single crystal region.

11. A method according to claim 1 wherein the step of forming the emitter region includes providing a conductive element which contacts said exposed region of said first layer through which said emitter region is outdiffused.

12. The method of claim 10 wherein the step of depositing a first layer of semiconductor material comprises non-selectively epitaxially growing said first layer.

13. The method of claim 12 wherein the step of forming an element of insulating material includes forming at least an oxidation barrier layer.

14. The method of claim 13 wherein the step of forming an element of insulating material includes forming an oxide buffer layer disposed between said first layer and said oxidation barrier layer.

15. The method of claim 14 wherein said oxidation barrier layer comprises silicon nitride and said oxide buffer layer comprise silicon dioxide.

16. The method of claim 14 wherein the step of depositing a second layer of semiconductor material comprises selectively epitaxially growing said second layer.

17. The method of claim 16 wherein the selective epitaxial deposition is performed under conditions whereby the width of said exposed region on said surface of said element is less than 0.5 microns.

18. The method of claim 16 wherein the width of the exposed region is 0.1 micron.

19. The method of claim 16 wherein said element has edges bounded in the (100) crystallographic direction, and said selective epitaxial layer laterally overgrows said element an amount equal to the vertical growth above said element thereby forming a substantially rectangular aperture.

20. The method of claim 16 wherein the step of forming a layer of insulating material on said second layer comprises depositing a thermal oxide layer under high pressure conditions.

* * * * *